(12) United States Patent
Liu et al.

(10) Patent No.: US 9,142,674 B2
(45) Date of Patent: Sep. 22, 2015

(54) FINFET DEVICES HAVING A BODY CONTACT AND METHODS OF FORMING THE SAME

(71) Applicant: GLOBALFOUNDRIES, Inc., Grand Cayman (KY)

(72) Inventors: Yanxiang Liu, Wappingers Falls, NY (US); Michael Hargrove, Clinton Corners, NY (US); Christian Gruensfelder, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/176,767

(22) Filed: Feb. 10, 2014

(65) Prior Publication Data
US 2014/0264633 A1 Sep. 18, 2014

Related U.S. Application Data

(60) Provisional application No. 61/799,049, filed on Mar. 15, 2013.

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01); *H01L 29/7851* (2013.01)

(58) Field of Classification Search
CPC ................. H01L 29/785; H01L 29/66795
USPC ........................................... 257/402
See application file for complete search history.

(56) References Cited

U.S. PATENT DOCUMENTS

| 7,241,649 | B2 | 7/2007 | Donze et al. | |
|---|---|---|---|---|
| 2003/0127690 | A1* | 7/2003 | Bryant et al. | 257/347 |
| 2004/0217420 | A1* | 11/2004 | Yeo et al. | 257/347 |
| 2006/0197140 | A1* | 9/2006 | Muralidhar et al. | 257/315 |
| 2009/0001464 | A1* | 1/2009 | Booth et al. | 257/347 |
| 2009/0008705 | A1 | 1/2009 | Zhu et al. | |
| 2009/0263949 | A1* | 10/2009 | Anderson et al. | 438/285 |
| 2011/0074498 | A1* | 3/2011 | Thompson et al. | 327/543 |
| 2012/0007180 | A1 | 1/2012 | Yin et al. | |
| 2013/0193526 | A1* | 8/2013 | Lo et al. | 257/401 |

* cited by examiner

*Primary Examiner* — Jarrett Stark
*Assistant Examiner* — Mohammad M Hoque
(74) *Attorney, Agent, or Firm* — Ingrassia Fisher & Lorenz, P.C.

(57) ABSTRACT

Fin field-effect transistor devices and methods of forming the fin field-effect transistor devices are provided herein. In an embodiment, a fin field-effect transistor device includes a semiconductor substrate that has a fin. A gate electrode structure overlies the fin. Source and drain halo and/or extension regions and epitaxially-grown source regions and drain regions are formed in the fin and are disposed adjacent to the gate electrode structure. A body contact is disposed on a contact surface of the fin, and the body contact is spaced separately from the halo and/or extension regions and the epitaxially-grown source regions and drain regions.

19 Claims, 6 Drawing Sheets

FINFET DEVICES HAVING A BODY CONTACT AND METHODS OF FORMING THE SAME

CROSS-REFERENCE TO RELATED APPLICATIONS

This application claims the benefit of U.S. Provisional Application No. 61/799,049, filed Mar. 15, 2013.

TECHNICAL FIELD

The technical field generally relates to fin field-effect transistor (FinFET) devices and methods of forming the same, and more particularly relates to FinFET devices having a body contact and methods of forming the FinFET devices having the body contact.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A Fin field-effect transistor (FinFET) is a type of transistor that lends itself to the dual goals of reducing transistor size while maintaining transistor performance. The FinFET is a three dimensional transistor formed in a thin fin that extends upwardly from a semiconductor substrate. Transistor performance, often measured by its transconductance, is proportional to the width of the transistor channel. In a FinFET the transistor channel is formed along the vertical sidewalls of the fin or on both vertical sidewalls and the top horizontal plane of the fin, so a wide channel, and hence high performance, can be achieved without substantially increasing the area of the substrate surface required by the transistor.

FinFETs provide a promising candidate for small line width technology (e.g., approximately 22 nm and below) because of their excellent short channel effect control and scalability. To be advantageous for general purpose applications, it is desirable for FinFETs to have different threshold voltages (Vt) that can be used for different circuit functionalities. However, manufacturing FinFETs with different threshold voltages is difficult. Because the channel or "fin" width is on the order of 5-20 nm, this dimension makes it ineffective to adjust Vt by changing channel doping concentration. Moreover, channel doping could degrade mobility, which may impact FinFET performance One possible way to obtain FinFETs with different Vt is to utilize different gate stack materials in High-K-Metal-Gate FinFET technology. However, multiple gate stack processes that are needed to produce FinFETs with different Vt are complex and expensive in the manufacturing process. Another way to obtain different Vt is through body bias. For example, in a conventional surface channel nFET, negative body bias increases Vt while positive body bias lowers Vt.

Methods have proposed to introduce a body contact to FinFET structures; however, these methods are either very complicated, non-practical in manufacturing, or the FinFET device characteristics are severely affected. For example, it has been proposed to use silicon epitaxy to connect bulk silicon of a semiconductor substrate to a poly gate, where a fin is formed overlying the bulk silicon of the semiconductor substrate. However, such methods are incompatible with replacement metal gate (RMG) techniques and require silicon epitaxy to be isolated to a contact region of the poly gates to the bulk silicon of the semiconductor substrate, and the body contacts are physically isolated from direct contact with the fin. Prior efforts to form body contacts for FinFETs have avoided formation of the body contacts on the fins due to doping of the fins to form source and drain regions for the FinFETs, and because the body contacts cannot be in direct physical contact with source and drain regions of the FinFETs while maintaining operability thereof.

Accordingly, it is desirable to provide FinFET devices and methods of forming such FinFET devices. It also is desirable to provide FinFET devices and methods of forming FinFET devices that avoid complications associated with forming body contacts on the same fin as a transistor that is in electrical communication with the body contact. Furthermore, other desirable features and characteristics of the present invention will become apparent from the subsequent detailed description of the invention and the appended claims, taken in conjunction with the accompanying drawings and this background of the invention.

BRIEF SUMMARY

Fin field-effect transistor devices and methods of forming the fin field-effect transistor devices are provided herein. In an embodiment, a fin field-effect transistor device includes a semiconductor substrate that has a fin. A gate electrode structure overlies the fin. Source and drain halo and/or extension regions and epitaxially-grown source regions and drain regions are formed in or on the fin and are disposed adjacent to the gate electrode structure. A body contact is disposed on a contact surface of the fin, and the body contact is spaced separately from the halo and/or extension regions and the epitaxially-grown source regions and drain regions.

In another embodiment, a fin field-effect transistor device includes a semiconductor substrate that has a fin. A first insulator layer overlies the semiconductor substrate and has a thickness less than a height of the fin. The fin extends through and protrudes beyond the first insulator layer to provide an exposed fin portion. A gate electrode structure overlies the exposed fin portion and is electrically insulated from the fin by a gate insulating layer. Source and drain halo and/or extension regions and epitaxially-grown source regions and drain regions are formed in or on the exposed fin portion and are disposed adjacent to the gate electrode structure. A body contact is disposed on a contact surface of the exposed fin portion. The body contact is spaced separately from the epitaxially-grown source regions and drain regions and is further spaced separately from the halo and/or extension regions. The body contact includes a concentration of dopant that biases a threshold voltage of the field-effect transistor. A contact insulating layer is disposed over the exposed fin portion, between the body contact and the halo and/or extension regions. A contact capping layer is disposed over the body contact and the contact insulating layer.

In another embodiment, a method of forming a fin field-effect transistor device includes providing a semiconductor substrate that has a fin. A gate electrode structure is formed overlying the fin. An implantation mask layer is patterned over a portion of the fin and over the gate electrode structure to expose source/drain portions of the fin adjacent to the gate electrode structure within which source and drain regions are to be formed. Ions are implanted into the exposed source/drain portions of the fin to form source and drain halo and/or extension regions adjacent to the gate electrode structure. The implantation mask layer is selectively removed, and a contact insulating layer is formed over the fin after selectively removing the implantation mask layer. A contact patterning layer is patterned over the contact insulating layer to expose a contact portion of the contact insulating layer. The contact portion of the contact insulating layer is selectively etched, thereby exposing a contact surface of the fin. The body contact is formed on the contact surface of the fin, and the body contact is spaced separately from the halo and/or extension regions. A source region and a drain region are epitaxially grown over the source and drain halo and/or extension regions.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Fin field-effect transistor (FinFET) devices and methods of forming the FinFET devices are provided herein that enable a voltage threshold (Vt) for a transistor to be modified as desired through biasing of a body contact. In particular, the FinFET devices include a body contact that is disposed on the same fin as a transistor that is in electrical communication with the body contact while maintaining operability of the transistor. The methods as described herein enable effective formation of the body contact by preventing direct physical contact between the body contact and source and drain regions of the transistor, even at nanometer-scale dimensional constraints. Because the body contact may be effectively formed on the same fin as the transistor that is in electrical communication therewith while maintaining operability of the transistor, the Vt for the transistor can be modified as desired through biasing of the body contact.

Figure 1:
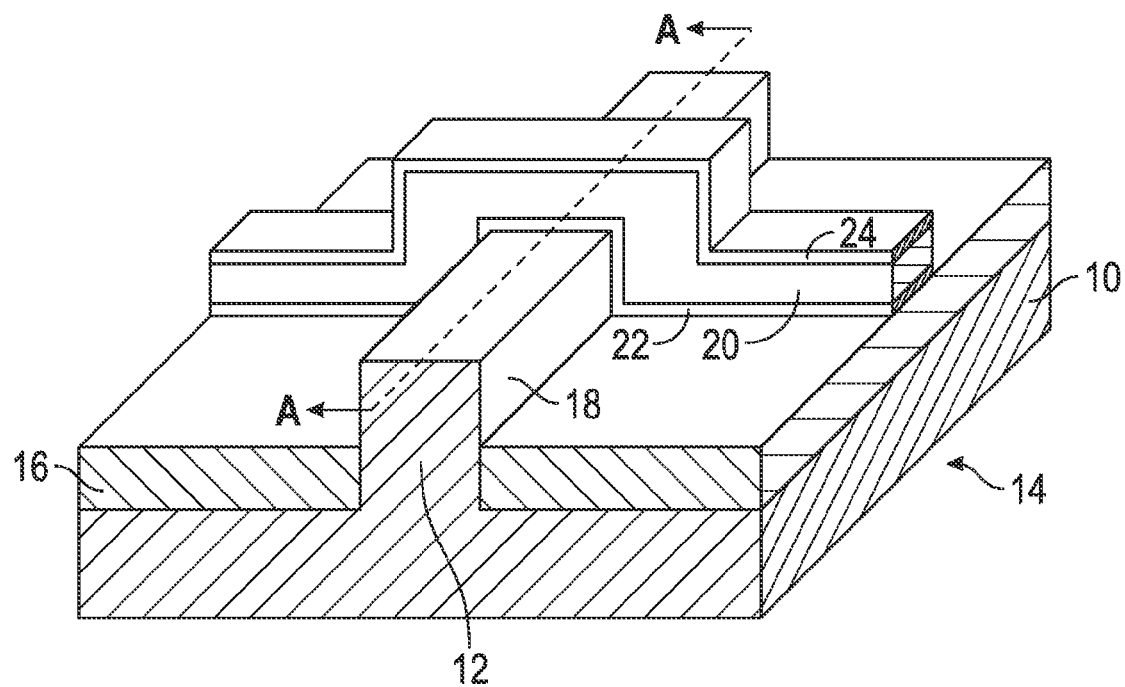
FIG. 1 is a perspective view of a portion of a semiconductor substrate including a fin formed therein and a gate electrode structure overlying the fin.

Referring to FIG. 1, in accordance with an exemplary embodiment of a method for forming a FinFET device, a semiconductor substrate 10 is provided with a fin 12 formed therein or thereon. Although not shown, it is to be appreciated that the semiconductor substrate 10 may include a plurality of fins 12 in accordance with conventional FinFET technology. Without intending to be limiting, the fins 12 may have a width on the nanometer scale, such as from about 5 to about 20 nm, although the FinFET devices and methods described herein are not limited to any particular dimensional constraints. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the semiconductor substrate 10 is a bulk silicon wafer with the fin 12 formed in the bulk silicon wafer. However, it is to be appreciated that in other embodiments and although not shown in the Figures, the semiconductor substrate 10 may include a silicon-containing material that is disposed on an insulating material, commonly known as a silicon-on-insulator (SOI) structure that, in turn, may be supported by a support substrate. For illustrative purposes, only a portion 14 of the semiconductor substrate 10 is shown in FIG. 1. In embodiments, the fin 12 is doped with a dopant chosen from P-type dopants or N-type dopants. For example, in an embodiment, the portion 14 of the semiconductor substrate 10 and the fin 12 are doped with a P-type dopant such as, but not limited to, boron, aluminum, gallium, indium, $BF_2$, and combinations thereof in anticipation of forming an N-type metal oxide semiconductor (NMOS) FinFET. However, it is to be appreciated that, although not shown, other portions of the semiconductor substrate may be doped with an N-type dopant such as, but not limited to, phosphorus, arsenic, antimony, and combinations thereof in anticipation of forming a P-type metal oxide semiconductor (PMOS) FinFET. In this regard, the methods described herein are suitable for forming either NMOS FinFETs or PMOS FinFETs, depending upon the particular materials that are employed for forming features of the respective FinFETs. If the FinFET device being fabricated is a complimentary MOS integrated circuit (CMOS IC), there will be at least one portion of the semiconductor substrate 10 and fin 12 that is doped with N-type dopant and at least one portion of the semiconductor substrate doped with P-type dopant. The portions of the semiconductor substrate 10 can be doped, for example, by ion implantation prior to or after forming the fin 12 in or on the semiconductor substrate 10, with the fin 12 including the dopant. Multiple ion implantation steps may be used to achieve the desired dopant concentration and profile. The dopant profile may be employed as one variable to establish a desired threshold voltage for a particular FinFET being fabricated.

Figure 2:
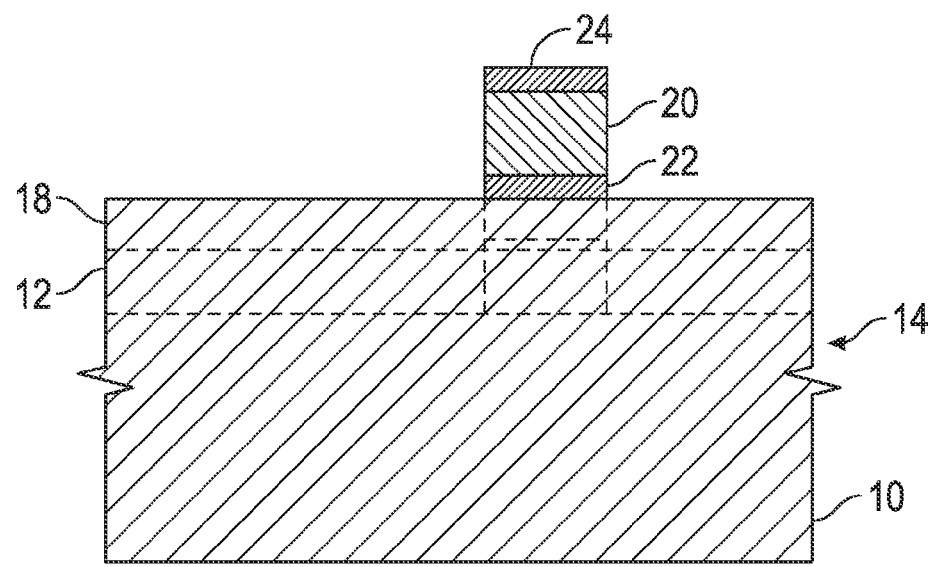
FIGS. 2-12 are cross-sectional side views of the semiconductor substrate of FIG. 1, taken along line A-A of FIG. 1, illustrating an exemplary method for fabricating a FinFET device including a body contact disposed on the same fin as a transistor that is in electrical communication with the body contact in accordance with an embodiment.

As shown in FIG. 1, a gate electrode structure 20 is disposed over the fin 12. For example, in an embodiment, a first insulator layer 16 overlies the semiconductor substrate 10 and has a thickness that is less than a height of the fin 12 such that the fin 12 extends through and protrudes beyond the first insulator layer 16 to provide an exposed fin portion 18. The first insulator layer 16 is not particularly limited and may include an oxide such as, for example, silicon dioxide. The gate electrode structure 20 overlies the fin 12 and, more specifically, overlies the exposed fin portion 18. The gate electrode structure 20 is electrically insulated from the fin 12 by a gate insulating layer 22. The gate electrode structure 20 may be formed over the fin 12 through conventional techniques, such as gate-first or gate-last, polysilicon/SiON or Hi-K/metal-gate techniques. For example and as shown in FIG. 1, a nitride cap 24 may be disposed overlying the gate electrode structure 20 to facilitate formation of the gate electrode structure 20 and to provide protection to the gate electrode structure 20 during formation of the FinFET device. The nitride cap 24 may be formed from any nitride such as, for example, silicon nitride. In an embodiment and as shown in FIG. 1, the gate electrode structure 20 wraps around the exposed fin portion 18, on three sides thereof, in accordance with conventional FinFET technology. FIG. 2 illustrates the portion 14 of the semiconductor substrate 10 of FIG. 1 in cross-section taken along line A-A for purposes of illustrating an exemplary method of forming the FinFET device.

Figure 3:
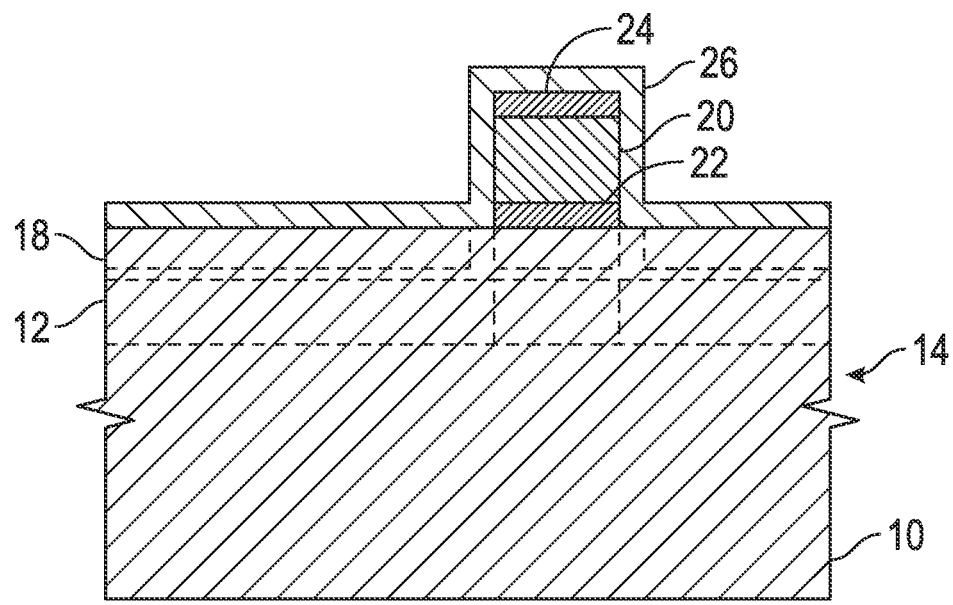
Figure 4:
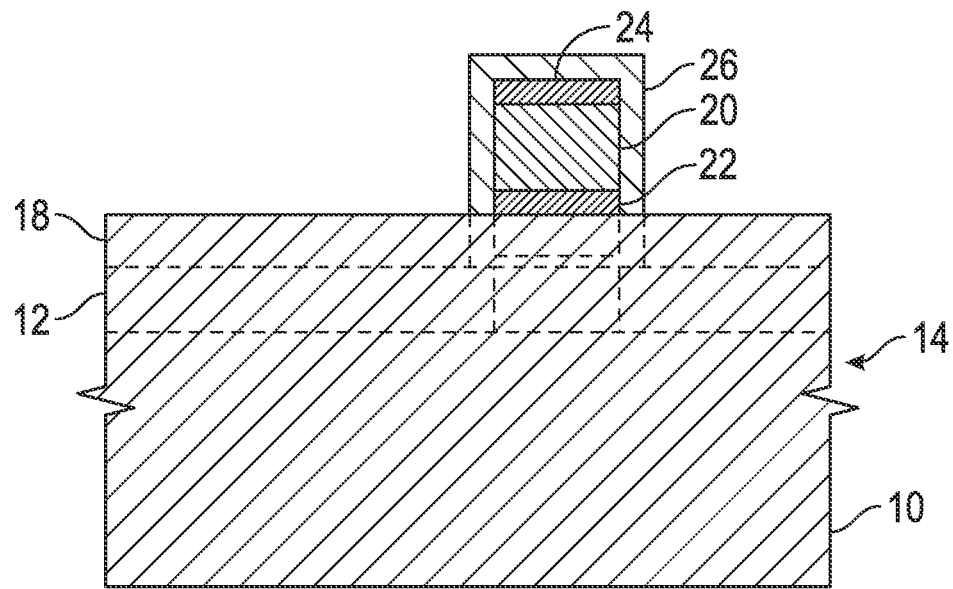

In an embodiment and as shown in FIG. 3, a second insulator layer 26 is formed over the exposed fin portion 18 and the nitride cap 24. The second insulator layer 26 may be formed from a nitride, such as the same nitride that is used to form the nitride cap 24 or the same nitride that is used to form low-k films, such as SiCON or SiCN. Portions of the second insulator layer 26 that are disposed on sidewalls of the gate electrode structure 20 ultimately remain in place as first sidewall spacers 26 in the FinFET devices as described in further detail below. More specifically, as shown in FIG. 4, portions of the second insulator layer that are disposed on horizontal surfaces are etched using a suitable etchant (e.g., a nitride etchant), with portions of the second insulator layer 26 that are disposed on sidewalls of the gate electrode structure 20 remaining as first sidewall spacers 26.

Figure 5:
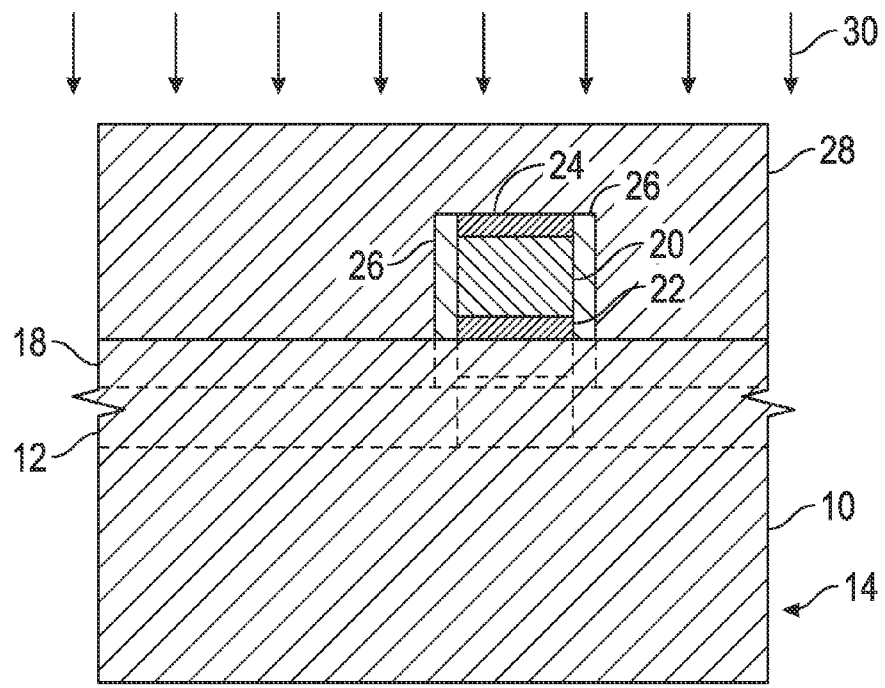

Referring to FIG. 5, in an embodiment, a first mask layer 28 is formed over the gate electrode structure 20 and the exposed fin portion 18, for purposes of shielding the exposed fin portion 18 in the portion 14 of the semiconductor substrate 10 that is shown in FIG. 5 during ion implantation 30 for other portions of the semiconductor substrate that are not shown. For example, in an embodiment and as shown in FIG. 5, the portion 14 of the semiconductor substrate 10 is doped with P-type dopants in anticipation of formation of an NMOS FinFET, and the ion implantation 30 as shown in FIG. 5 may be employed to form extension and/or halo regions (not shown) for PMOS FinFETs on the other portions of the semiconductor substrate 10 that are not shown. However, it is to be appreciated that formation of the first mask layer 28 is optional and is dependent upon the type of FinFET to be formed. In an embodiment, the first mask layer 28 is formed from a material that can be selectively removed from over the gate electrode structure 20 and the portion 14 of the semiconductor substrate 10. By "selectively removed", it is meant that one material has a higher etch rate in a particular etchant than another material, or that the material of the first mask layer 28 can be removed with minimal removal of material from underlying structures. For example, in an embodiment, the first mask layer 28 is formed from a resist material, such as a photoresist. After completing ion implantation 30, the first mask layer 28 is selectively removed through etching with an appropriate etchant (e.g., an oxide etchant), and the gate electrode structure 20 and the portion 14 of the semiconductor substrate 10 are optionally cleaned through conventional techniques.

Figure 6:
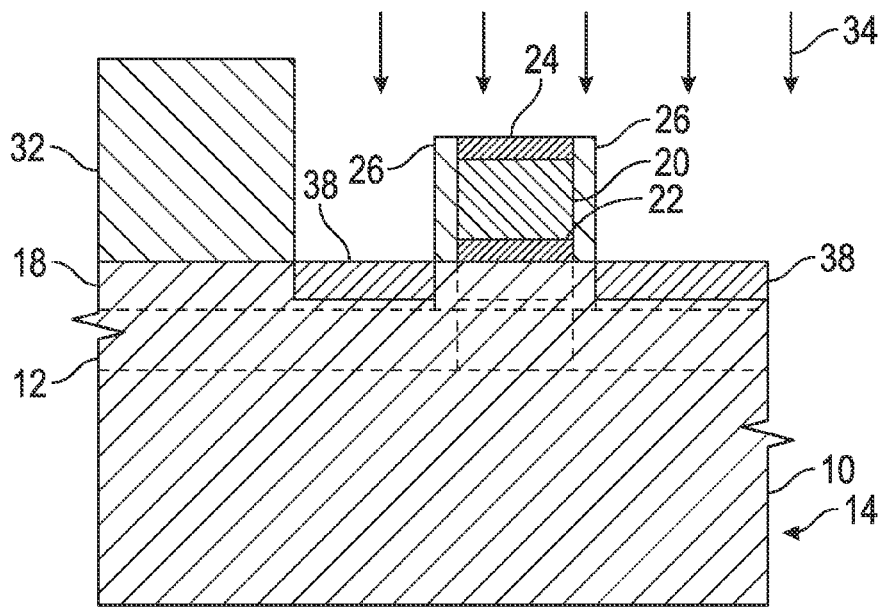

In an embodiment and as shown in FIG. 6, after selectively removing the first mask layer and optional cleaning, an implantation mask layer 32 is patterned over the portion 14 of the semiconductor substrate 10, including over the exposed fin portion 18, as well as over the first sidewall spacers 26 and the gate electrode structure 20 to expose source/drain portions of the exposed fin portion 18 that are adjacent to the gate electrode structure 20 and within which source and drain regions for the FinFET are to be formed. The implantation mask layer 32 may be formed from the same materials as the first mask layer to enable the implantation mask layer 32 to be selectively removed. The implantation mask layer 32 is generally disposed over and masks portions of the exposed fin portion 18 where a body contact is to be formed, as described in further detail below. In this manner, separation of the body contact from the source and drain regions can be effectively maintained, even while forming the body contact on the exposed fin portions 18, by isolating formation of the source and drain regions to regions of the semiconductor substrate 10 that are immediately adjacent to the first sidewall spacers 26. Ion implantation 34 is then conducted into the exposed fin portion 18 immediately adjacent to the first sidewall spacers 26 to form source and drain halo and/or extension regions 38 adjacent to the first sidewall spacers 26 through conventional ion implantation techniques. For simplicity, FIG. 6 only generally illustrates halo and/or extension regions 38 formed in the semiconductor substrate 10, although it is to be appreciated that configurations of particular halo and/or extension regions 38 are dynamic and vary depending upon performance considerations for particular FinFET devices. The implantation mask layer 32 isolates formation of the halo and/or extension regions 38 to the particular regions of the semiconductor substrate 10 that are exposed in the pattern of the implantation mask layer 32. After completing ion implantation 34, the implantation mask layer 32 is selectively removed, and the gate electrode structure 20 and the portion 14 of the semiconductor substrate 10 are optionally cleaned through conventional techniques.

Figure 7:
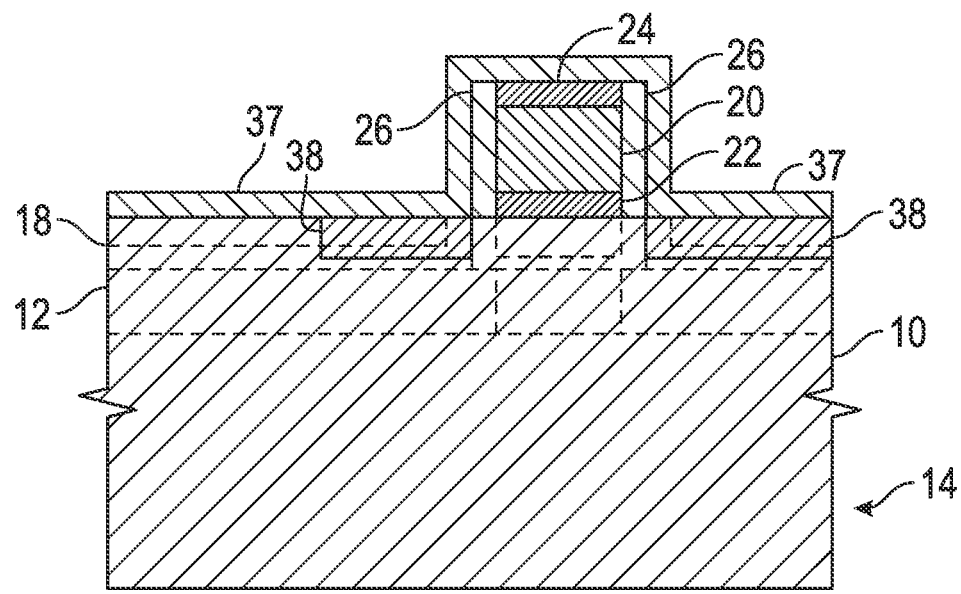
Figure 8:
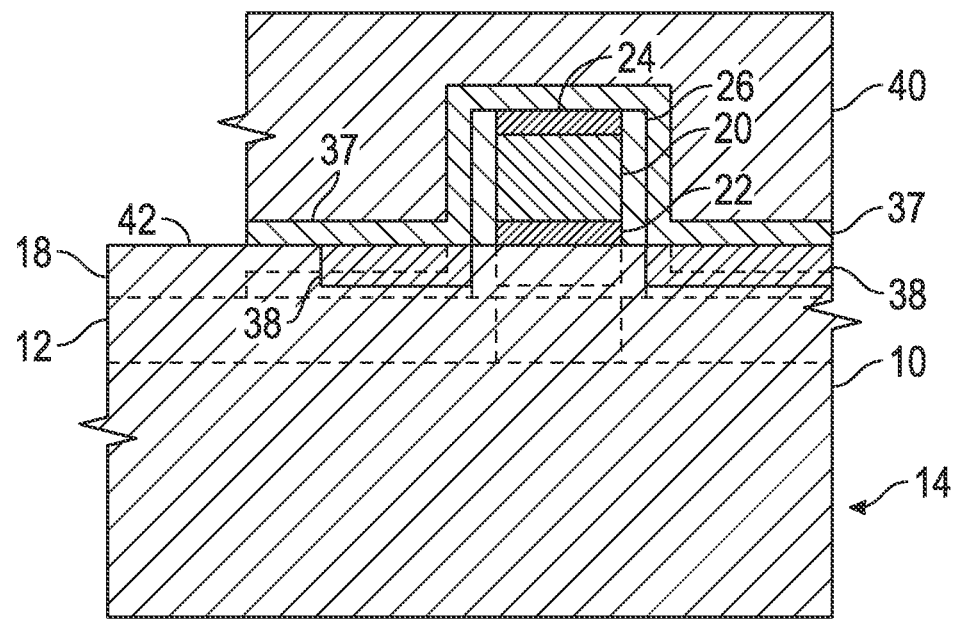

In an embodiment and as shown in FIG. 7, after formation of the halo and/or extension regions 38 and removal of the implantation mask layer 32, a contact insulating layer 37 is formed over the portion 14 of the semiconductor substrate 10, including over the exposed fin portion 18, as well as over the first sidewall spacers 26, the halo and/or extension regions 38, and the gate electrode structure 20. The contact insulating layer 37 may be formed from the same material as the second insulator layer 26. In an embodiment and as shown in FIG. 8, a contact patterning layer 40 is patterned over the contact insulating layer 37 to expose a contact portion of the contact insulating layer 37, which overlies a contact surface 42 upon which a body contact is to be formed. In this regard, to maintain spacing between the body contact and the halo and/or extension regions 38, the contact patterning layer 40 completely covers previously exposed portions of the exposed fin portion 18 into which the halo and/or extension regions 38 were formed, and further covers portions of the exposed fin portion 18 that are immediately adjacent to the halo and/or extension regions 38 as shown in FIG. 8. The contact patterning layer 40 may be formed from the same materials as the first mask layer and the implantation mask layer to enable the contact patterning layer 40 to be selectively removed. Once patterned, the pattern in the contact patterning layer 40 enables the contact portion of the contact insulating layer 37 that is exposed by the contact patterning layer 40 to be selectively removed, thereby exposing the contact surface 42 of the exposed fin portion 18 where the body contact is to be formed. The contact portion of the contact insulating layer 37 may be etched through reactive ion etching (RIE) with a suitable nitride etchant such as, but not limited to, $CF_4$. After selectively etching the contact portion of the contact insulating layer 37, the contact patterning layer 40 is selectively removed, and the contact insulating layer 37 is optionally cleaned through conventional techniques.

Figure 9:
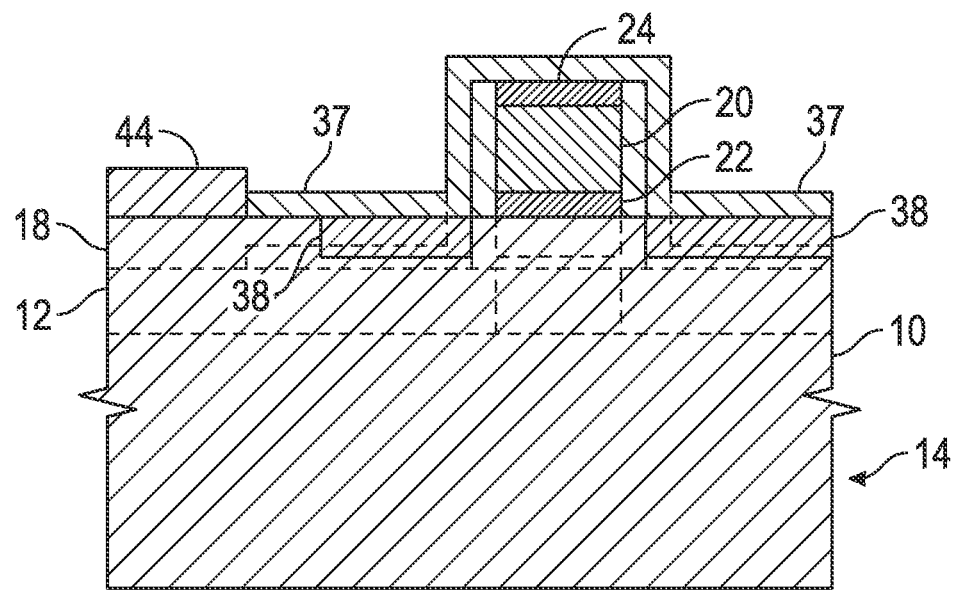

In an embodiment and as shown in FIG. 9, the body contact 44 is formed on the contact surface 42 of the exposed fin portion 18. In particular, the body contact 44 is formed by epitaxially growing semiconductor material on the contact surface 42 of the exposed fin portion 18, and the body contact 44 only forms on the contact surface 42 of the exposed fin portion 18 without forming on the contact insulating layer 37. Although not shown, it is to be appreciated that the contact surface 42 of the exposed fin portion 18 may be etched prior to forming the body contact 44, thereby recessing the body contact 44 into the exposed fin portion 18. Further, the body contact 44 is appropriately spaced separately from the halo and/or extension regions 38 due to the presence of the contact insulating layer 37 being disposed over the halo and/or extension regions 38 and over portions of the exposed fin portion 18 that are immediately adjacent to the halo and/or extension regions 38. By "spaced separately", it is meant that the body contact 44 does not contact the halo and/or extension regions 38, although for device operation, the body contact is generally close to the halo and/or extension regions 38 to achieve low serial resistance. The contact insulating layer 37 ultimately remains disposed over the exposed fin portion 18 between the body contact 44 and the halo and/or extension regions 38 for electrically insulating the body contact from the halo and/or extension regions 38. Suitable semiconductor materials for forming the body contact 44 include any of those set forth above for the semiconductor substrate 10. In an embodiment, the body contact 44 is doped with the same type of dopant, either N-type or P-type, as the portion 14 of the semiconductor substrate 10 and, by extension, the fin 12. For example, if the portion 14 of the semiconductor substrate 10 is doped with P-type dopant, the body contact is also doped with P-type dopant that may be the same or different from the P-type dopant of the portion 14 of the semiconductor substrate 10, such as boron. As another example, if the portion 14 of the semiconductor substrate 10 is doped with N-type dopant, the body contact is also doped with N-type dopant that may be the same or different from the N-type dopant of the portion 14 of the semiconductor substrate 10, such as carbon. For example, in an embodiment, the body contact 44 may be formed from N-type or P-type semiconductors, depending upon whether the portion 14 of the semiconductor substrate 10 is formed from N-type or P-type materials. As one specific example, for a P-type body contact 44, silicon germanium may be used. As alluded to above, the Vt of the FinFET may be adjusted by body biasing, and body biasing is accomplished through establishing a high conductivity from the body contact 44 to a device channel. A low contact resistance of the body contact 44 may be established through appropriate doping. In this regard, the body contact may be formed having a concentration of dopant that establishes the contact resistance at suitably low levels. Higher dopant concentrations generally decrease series resistance of the body contact 44.

Figure 10:
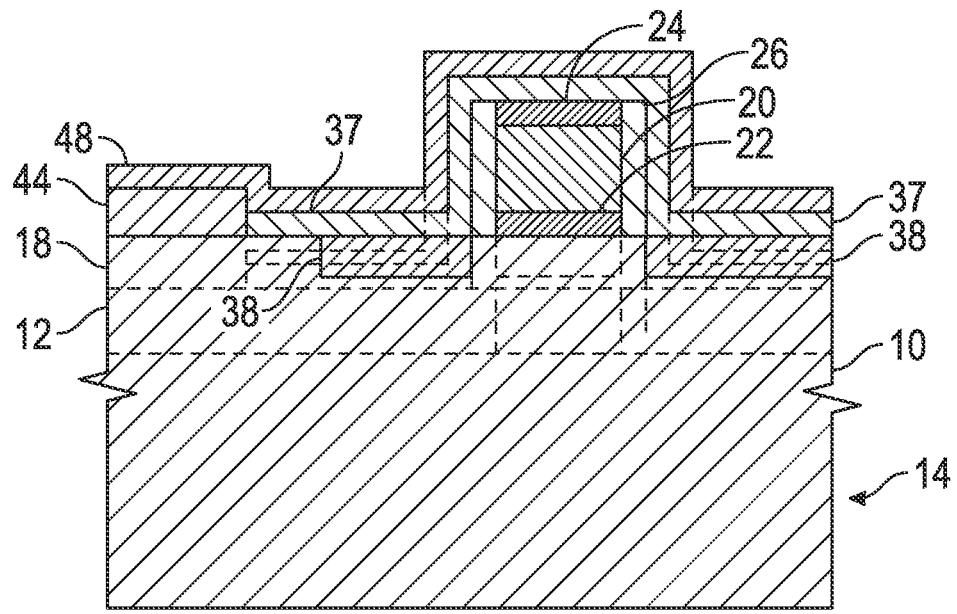
Figure 11:
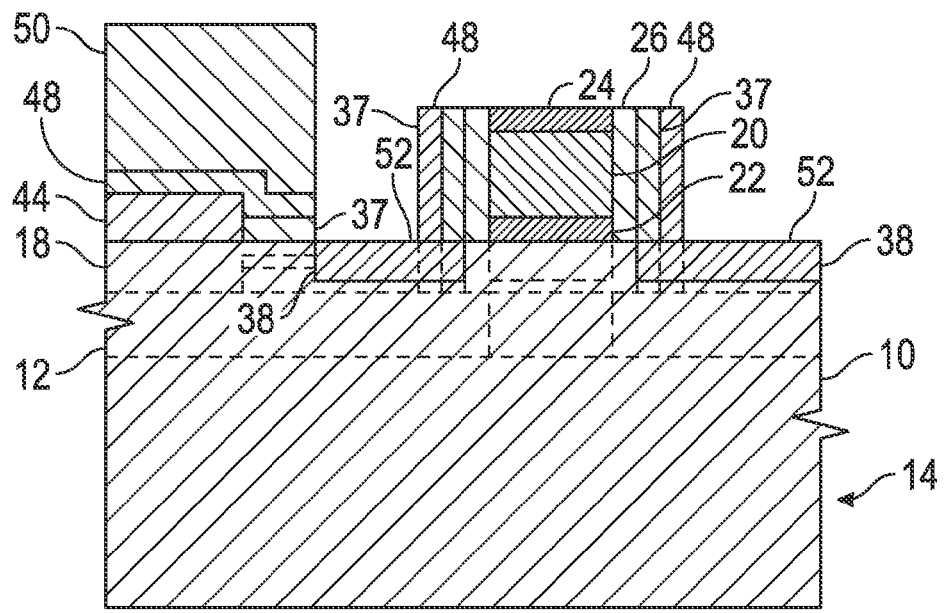
Figure 12:
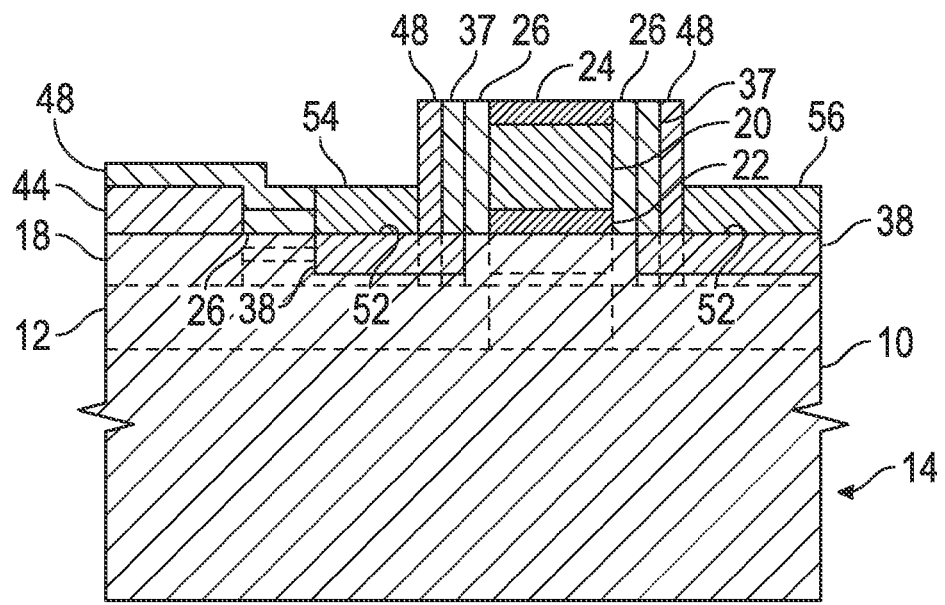

In an embodiment and referring to FIGS. 10-12, after forming the body contact 44, the halo and/or extension regions 38 are exposed to enable formation of epitaxially-grown source regions and drain regions over the halo and/or extension regions 38. However, in other embodiments and although not shown, it is to be appreciated that epitaxially-grown source regions and drain regions may be formed over the halo and/or extension regions 38 prior to forming the body contact 44. Further still, it is to be appreciated that certain body contacts may be formed before certain epitaxially-grown source regions and drain regions. For example, in embodiments, epitaxially-grown source regions and drain regions for PFETs may be formed prior to forming epitaxially-grown source regions and drain regions for NFETs. Therefore, body contacts for the NFETs may be formed before epitaxially-grown source regions and drain regions for the NFETs are formed. Further, in this embodiment, body contacts for the PFETs may be formed after epitaxially-grown source regions and drain regions for PFETs are formed.

In an embodiment and as shown in FIG. 10, a contact capping layer 48 is formed over the body contact 44 and the contact insulating layer 37. The contact capping layer 48 is formed primarily to shield the body contact 44 during epitaxial growth of the source regions and drain regions. The contact capping layer 48 may be formed from the same material as the second insulator layer 26 and the contact insulating layer 37 to enable the contact capping layer 48 and the contact insulating layer 37 to be removed with the same etchant. In an embodiment and as shown in FIG. 11, a cap patterning layer 50 is patterned over the contact capping layer 48 to expose portions of the contact capping layer 48 that overlie the halo and/or extension regions 38, with portions of the contact capping layer 48 remaining over the body contact 44 and the contact insulating layer 37. The cap patterning layer 50 may be formed from the same materials as the first mask layer, second implantation layer, and/or contact patterning layer to enable the cap patterning layer 50 to be selectively removed from the contact capping layer 48. The pattern in the cap patterning layer 50 enables portions of the contact capping layer 48 that are exposed by the cap patterning layer 50 to be selectively etched. Because the contact capping layer 48 may be formed from the same material as the contact insulating layer 37, the contact insulating layer 37 that underlies the contact capping layer 48 is also selectively etched, thereby exposing surfaces 52 of the halo and/or extension regions 38 where the epitaxially-grown source regions and drain regions are to be formed. Portions of the contact insulating layer 37 and the contact capping layer 48 that overlie the gate electrode structure 20 are also removed during selective etching, with portions of the contact insulating layer 37 and the contact capping layer 48 that are disposed on vertical surfaces, such as on the first sidewall spacers 26, remaining. After selectively etching the portions of the contact capping layer 48 that are exposed by the cap patterning layer 50, and after further selectively etching the underlying portions of the contact insulating layer 37, the cap patterning layer 50 is selectively removed from the underlying contact capping layer 48, and the exposed contact capping layer 48 is optionally cleaned through conventional techniques.

In an embodiment and as shown in FIG. 12, epitaxially-grown source regions 54 and drain regions 56 are formed over the halo and/or extension regions 38. In particular, the epitaxially-grown source regions 54 and drain regions 56 may be formed in substantially the same manner as the body contact 44, by epitaxially growing semiconductor material on the fin 12 and, more specifically, on the surface 52 of the halo and/or extension regions 38. In embodiments, the epitaxially-grown source regions 54 and drain regions 56 only form on the surface 52 of the halo and/or extension regions 38 without forming on the contact capping layer 48 that remains over the body contact 44. In this manner, the body contact 44 is also spaced separately from the epitaxially-grown source regions 54 and drain regions 56. Although not shown, it is to be appreciated that the surface 52 of the halo and/or extension regions 38 may be etched prior to forming the epitaxially-grown source regions 54 and drain regions 56, thereby recessing the epitaxially-grown source regions 54 and drain regions 56 into the halo and/or extension regions 38 and the exposed fin portion 18. Further, the contact capping layer 48 may ultimately remain disposed over the body contact 44 and the contact insulating layer 37, and the contact capping layer 48 maintains appropriate spacing between the body contact 44 and the epitaxially-grown source regions 54 and drain regions 56. Suitable semiconductor materials for forming the epitaxially-grown source regions 54 and drain regions 56 include any of those set forth above for the semiconductor substrate 10 and for the body contact 44. Further, the epitaxially-grown source regions 54 and drain regions 56 are an opposite type, either N-type or P-type, from the body contact 44 and the portion 14 of the semiconductor substrate 10. For example, if the portion 14 of the semiconductor substrate 10 is doped with P-type dopant or are formed from P-type semiconductor material, the epitaxially-grown source regions 54 and drain regions 56 are doped with N-type dopant or formed from N-type semiconductor material.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A fin field-effect transistor device comprising:
    a semiconductor substrate having a fin;
    a gate electrode structure overlying the fin;
    first sidewall spacers disposed on sidewalls of the gate electrode structure;
    source and drain halo and/or extension regions and epitaxially-grown source regions and drain regions formed in or on the fin and disposed adjacent to the gate electrode structure; and
    a body contact disposed on a contact surface of the fin, wherein the body contact is spaced separately from the halo and/or extension regions and the epitaxially-grown source regions and drain regions;
    a contact insulating layer disposed over the fin, between the body contact and the halo and/or extension regions; and
    a contact capping layer disposed over the body contact and the contact insulating layer.

2. The device of claim 1, wherein the body contact comprises a concentration of dopant that biases a threshold voltage of the field-effect transistor device.

3. The device of claim 1, further comprising a first insulator layer overlying the semiconductor substrate and having a thickness less than a height of the fin, with the fin extending through and protruding beyond the first insulator layer to provide an exposed fin portion.

4. The device of claim 3, wherein the source and drain halo and/or extension regions, the epitaxially-grown source regions and drain regions, and the body contact are formed in or on the exposed fin portion.

5. The device of claim 4, wherein the body contact comprises epitaxially-grown semiconductor material formed only on the exposed fin portion.

6. The device of claim 1, wherein the fin is doped with a dopant chosen from P-type dopants and N-type dopants.

7. The device of claim 6, wherein the body contact is doped with the same type of dopant as the fin.

8. The device of claim 1, wherein the body contact is undoped and comprises semiconductor material chosen from N-type or P-type semiconductors.

9. A fin field-effect transistor device comprising:
    a semiconductor substrate having a fin;
    a first insulator layer overlying the semiconductor substrate and having a thickness less than a height of the fin, with the fin extending through and protruding beyond the first insulator layer to provide an exposed fin portion;
    a gate electrode structure overlying the exposed fin portion and electrically insulated from the fin by a gate insulating layer;
    first sidewall spacers disposed on sidewalls of the gate electrode structure;
    source and drain halo and/or extension regions and epitaxially-grown source regions and drain regions formed in the exposed fin portion and disposed adjacent to the gate electrode structure;
    a body contact disposed on a contact surface of the exposed fin portion, wherein the body contact is spaced separately from the epitaxially-grown source regions and drain regions and is further spaced separately from the halo and/or extension regions, and wherein the body contact comprises a concentration of dopant that biases a threshold voltage of the field-effect transistor;
    a contact insulating layer disposed over the exposed fin portion, between the body contact and the halo and/or extension regions; and
    a contact capping layer disposed over the body contact and the contact insulating layer.

10. A method of forming a fin field-effect transistor device, the method comprising:
    providing a semiconductor substrate having a fin;
    forming a gate electrode structure overlying the fin;
    forming first sidewall spacers on sidewalls of the gate electrode structure;
    patterning an implantation mask layer over a portion of the fin and over the gate electrode structure to expose source/drain portions of the fin adjacent to the gate electrode structure within which source and drain regions are to be formed;
    implanting ions into the exposed source/drain portions of the fin to form source and drain halo and/or extension regions adjacent to the gate electrode structure;
    selectively removing the implantation mask layer;
    forming a contact insulating layer over the fin after selectively removing the implantation mask layer;
    patterning a contact patterning layer over the contact insulating layer to expose a contact portion of the contact insulating layer;
    selectively etching the contact portion of the contact insulating layer to expose a contact surface of the fin;
    forming the body contact on the contact surface of the fin, wherein the body contact is spaced separately from the halo and/or extension regions;
    forming a contact capping layer over the body contact and the contact insulating layer; and
    epitaxially growing a source region and a drain region over the source and drain halo and/or extension regions after forming the contact capping layer.

11. The method of claim 10, wherein forming the body contact comprises forming the body contact having a concentration of dopant that biases a threshold voltage of the fin field-effect transistor device.

12. The method of claim 10, wherein providing the semiconductor substrate comprises providing the semiconductor substrate with a first insulator layer overlying the semiconductor substrate and having a thickness less than a height of the fin, with the fin extending through and protruding beyond the first insulator layer to provide an exposed fin portion, and with the gate electrode structure overlying the exposed fin portion and electrically insulated from the fin by a gate insulating layer.

13. The method of claim 12, wherein forming the body contact comprises epitaxially growing semiconductor material on the surface of the exposed fin portion.

14. The method of claim 10, further comprising exposing a surface of the source and drain halo and/or extension regions after forming the body contact.

15. The method of claim 14, wherein epitaxially growing the source region and the drain region comprises epitaxially growing the source region and the drain region only over the source and drain halo and/or extension regions after exposing the surface of the source and drain halo and/or extension regions.

16. The method of claim 10, wherein patterning the implantation mask layer over the portion of the fin and over the gate electrode structure comprises patterning the implantation mask layer with the implantation mask layer disposed over and masking portions of the fin where the body contact is formed.

17. The method of claim 10, wherein patterning the contact patterning layer comprises patterning the contact patterning layer to cover portions of the fin into which the halo and/or extension regions are formed, and to further cover portions of the fin adjacent to the halo and/or extension regions.

18. The device of claim 1, wherein portions of the contact insulating layer and the contact capping layer are disposed on the first sidewall spacers.

19. The device of claim 1, wherein the contact capping layer is disposed over the entire body contact.

* * * * *